(12) United States Patent
Sugimoto

(10) Patent No.: US 6,232,838 B1
(45) Date of Patent: May 15, 2001

(54) FEED-FORWARD AMPLIFIER AND METHOD OF COMPENSATING NON-LINEAR DISTORTION IN THE SAME

(75) Inventor: Katsuyoshi Sugimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/634,167

(22) Filed: Aug. 9, 2000

(30) Foreign Application Priority Data

Aug. 10, 1999 (JP) ................................................. 11-225918

(51) Int. Cl.[7] ................................. H03F 1/00; H03F 1/26
(52) U.S. Cl. ............................................. 330/151; 330/149
(58) Field of Search ..................................... 330/149, 151, 330/52

(56) References Cited

U.S. PATENT DOCUMENTS 5,789,976 * 8/1998 Ghannouchi et al. ................. 330/52
5,877,653 * 3/1999 Kim et al. ............................. 330/149
6,011,434 * 3/1999 Sakai ..................................... 330/151
6,078,216 * 6/2000 Proctor, Jr. ............................ 330/151

FOREIGN PATENT DOCUMENTS 10-284951    10/1998 (JP) .

* cited by examiner

*Primary Examiner*—Robert Pascal
*Assistant Examiner*—Patricia T. Nguyen
(74) *Attorney, Agent, or Firm*—Ostrolenk, Faber, Gerb & Soffen, LLP

(57) ABSTRACT

A first vector modulator is inserted in the input route of an amplifier to vary the input signal of the amplifier. A second vector amplifier is inserted in the second signal route to vary the input signal of the second signal route. A controller controls the first vector modulator to minimize the distortion of the amplifier and controls the second modulator to equalize a change in input signal of the amplifier due to the control operation to a change in input signal of the second signal route.

13 Claims, 2 Drawing Sheets

Figure 1:
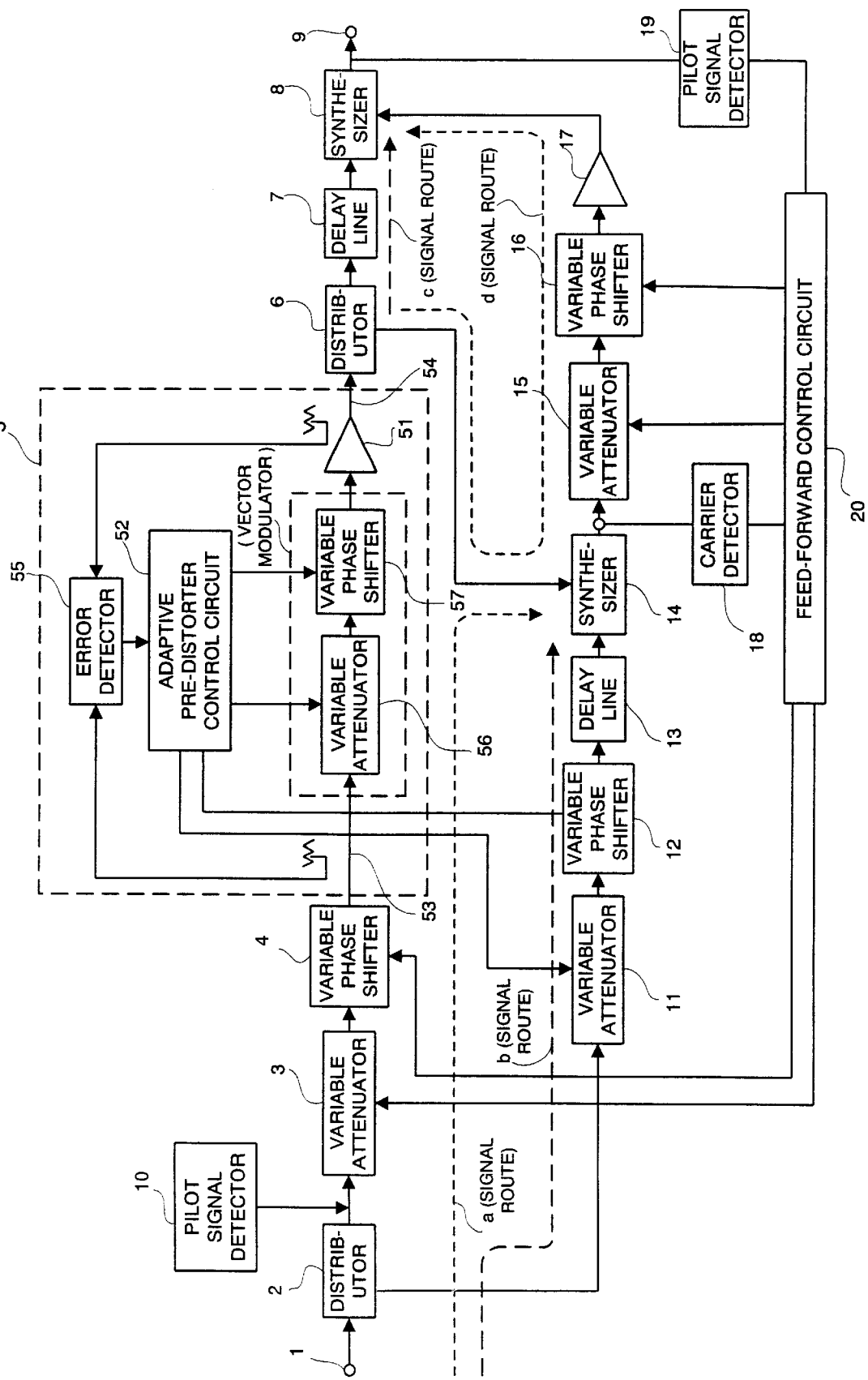

FEED-FORWARD AMPLIFIER AND METHOD OF COMPENSATING NON-LINEAR DISTORTION IN THE SAME

BACKGROUND OF THE INVENTION

The present invention relates to a feed forward amplifier. Particularly, the present invention relates to a technique of being capable of improving the distortion removing effect by feed forward even when non-linear distortion of a main amplifier is compensated using an adaptive pre-distortion compensation method.

Recently, various feed-forward amplifiers are being developed. For example, according to the technique disclosed in JP-A-No. 284951/1998, the feed-forward amplifier includes a pre-distortion compensation circuit 3, a variable attenuator 4, a variable phase shifter 5, and a main amplifier 6, arranged in the listed order. The control circuit 19 controls the variable attenuator 4 and the variable phase shifter 5 to minimize the carrier component, or an input signal, in detected distortion components. The technique disclosed in the above publication can compensate distortions even if there are temperature variations.

A pre-distorter (pre-distortion compensator) is disposed on the main amplifier side of a distortion detection loop to relieve the burden of the auxiliary amplifier used in a feed-forward amplifier. The use of an adaptive pre-distorter (adaptive pre-distortion compensator) in an adaptive pre-distortion system, which can reduce non-linear distortion more than the pre-distorter, is being developed. The adaptive pre-distortion system is one of compensating non-linear distortions produced in amplifiers. According to this system, the characteristics reversed to characteristics of an amplifier are provided to an input signal. Thus, this pre-distortion system, which linearly operates an amplifier apparently, can adaptively deal with changes in characteristic of the amplifier due to changes in ambient environment.

However, there is the problem that when the adaptive pre-distorter is used to compensate non-linear distortion of the main amplifier, the vector modulator controlled by the adaptive pre-distorter may rather deteriorate the distortion decreasing effect by the feed forward.

SUMMARY OF THE INVENTION

The present invention is made to solve the above-mentioned problems.

Moreover, the present invention is made to solve the above mentioned problems. The objective of the invention is to provide a technique of being capable of improving the distortion removing effect of a feed-forward amplifier even when non-linear distortion of a main amplifier is compensated using an adaptive pre-distorter.

In order to achieve the above-mentioned problem, the feed-forward amplifier comprises a first signal route having an amplifier; a second signal route for creating a signal having the same amplitude as that of a signal input to the first signal route and having a phase reversed to the phase of the input signal; wherein the feed-forward amplifier detects a distorted component of a signal amplified by the amplifier based on a signal passing through the first signal route and a signal passing through the second signal route, and removes the distorted component of the signal amplified by the amplifier based on the detected distorted component; a first vector modulator disposed in an input route of the amplifier, for varying an input signal of the amplifier; a second vector modulator disposed in the second signal route, for varying an input signal of the second signal route; and control means for controlling the first vector modulator to minimize distortion of the amplifier and controlling the second vector modulator to equalize a change in input signal of the amplifier due to the control to a change in input signal of the second signal route.

According to the present invention, the feed-forward amplifier can improve the distortion removing effect of the entire feed-forward amplifier by varying an input signal on the second signal route by the same degree as that of the input signal of the amplifier.

Moreover, the above-mentioned problem is solved by the feed-forward amplifier comprising a first signal route having an amplifier; a second signal route for creating a signal having the same amplitude as that of a signal input to the first signal route and having a phase reversed to the phase of the input signal; wherein the feed-forward amplifier detects a distorted component of a signal amplified by the amplifier based on a signal passing through the first signal route and a signal passing through the second signal route, and removes the distorted component of the signal amplified by the amplifier based on the detected distorted component; a first vector modulator disposed in an input route of the amplifier, for varying an input signal of the amplifier; a second vector modulator disposed in the second signal route, for varying an input signal of the second signal route; and control means for controlling the first vector modulator to minimize distortion of the amplifier and controlling the second vector modulator with the same amount as that of the above control.

A change in input signal of the amplifier is equalized to a change in input signal on the second signal route by controlling the second vector modulator with the same control amount as that of the first vector modulator.

Moreover, the above-mentioned problem is solved by a feed-forward amplifier comprising a first signal route having an amplifier; a second signal route for creating a signal having the same amplitude as that of a signal input to the first signal route and having a phase reversed to the phase of the input signal; wherein the feed-forward amplifier detects a distorted component of a signal amplified by the amplifier based on a signal passing through the first signal route and a signal passing through the second signal route, and removes the distorted component of the signal amplified by the amplifier based on the detected distorted component; a first vector modulator disposed in an input route of the amplifier, for varying the phase of an input signal of the amplifier; a second vector modulator disposed in the second signal route, for varying the phase of an input signal of the second signal route; and control means for controlling a phase change of the first vector modulator to minimize non-linear distortion of the amplifier and controlling the second vector modulator to the same phase change as that of the first vector modulator.

Moreover, the above-mentioned problem is solved by a feed-forward amplifier comprising a first signal route having an amplifier; a second signal route for creating a signal having the same amplitude as that of a signal input to the first signal route and having a phase reversed to the phase of the input signal; wherein the feed-forward amplifier detects a distorted component of a signal amplified by the amplifier based on a signal passing through the first signal route and a signal passing through the second signal route, and removes the distorted component of the signal amplified by the amplifier based on the detected distorted component; a first vector modulator disposed in an input route of the amplifier, for varying an input signal of the amplifier; a second vector modulator disposed in the second signal route, for varying an input signal of the second signal route; first detection means for detecting the waveform of an input signal of the first vector modulator; second detection means disposed for detecting the waveform of an output signal of the amplifier; means for outputting a difference between a waveform detected by the first detection means and a waveform detected by the second detection means; and control means for controlling the first vector modulator to minimize the difference and controlling the second vector modulator to equalize a change in input signal of the amplifier due to the control to a change in input signal of the second signal route.

Particularly, the first vector modulator comprises a variable attenuator and a variable phase shifter. The second vector modulator comprises a variable attenuator and a variable phase shifter.

Moreover, the first vector modulator is controlled in an adaptive pre-distortion system.

According to the present invention, even when the adaptive pre-distorter controls non-linear distortion of the amplifier, the distortion removing effect of the feed-forward amplifier can be improved by varying the input signal of the second signal route by the same change as that of the input signal of the amplifier.

Moreover, the above-mentioned problem is solved by a non-linear compensation method in a feed-forward amplifier, the feed-forward amplifier including a first signal route having an amplifier and a second signal route for receiving a signal input to the first signal route and creating a signal having the same amplitude as that of the input signal and having a phase reversed to the phase of the input signal, the feed-forward amplifier detecting a distorted component of a signal amplified by the amplifier based on a signal passing through the first signal route and a signal passing through the second signal route, and detecting the removed distorted component of the signal amplified by the amplifier based on the detected distorted component, the non-linear compensation method comprising a first detection step for detecting the waveform of an input signal of the amplifier; a second detection step for detecting the waveform of an output signal of the amplifier; a third detection step for detecting a difference between the waveform of an output signal detected in the first detection step and the waveform of an output signal detected in the second detection step; a step for varying an input signal of the amplifier to minimize the difference detected in the third detection step; and a step for varying an input signal of the second signal route to the same change as a change in input signal of the amplifier.

According to the present invention, the distortion removing effect of the feed-forward amplifier can be improved by varying the input signal of the second signal route by the same level as that of the input signal of the amplifier.

BRIEF DESCRIPTION OF THE INVENTION

Figure 2:
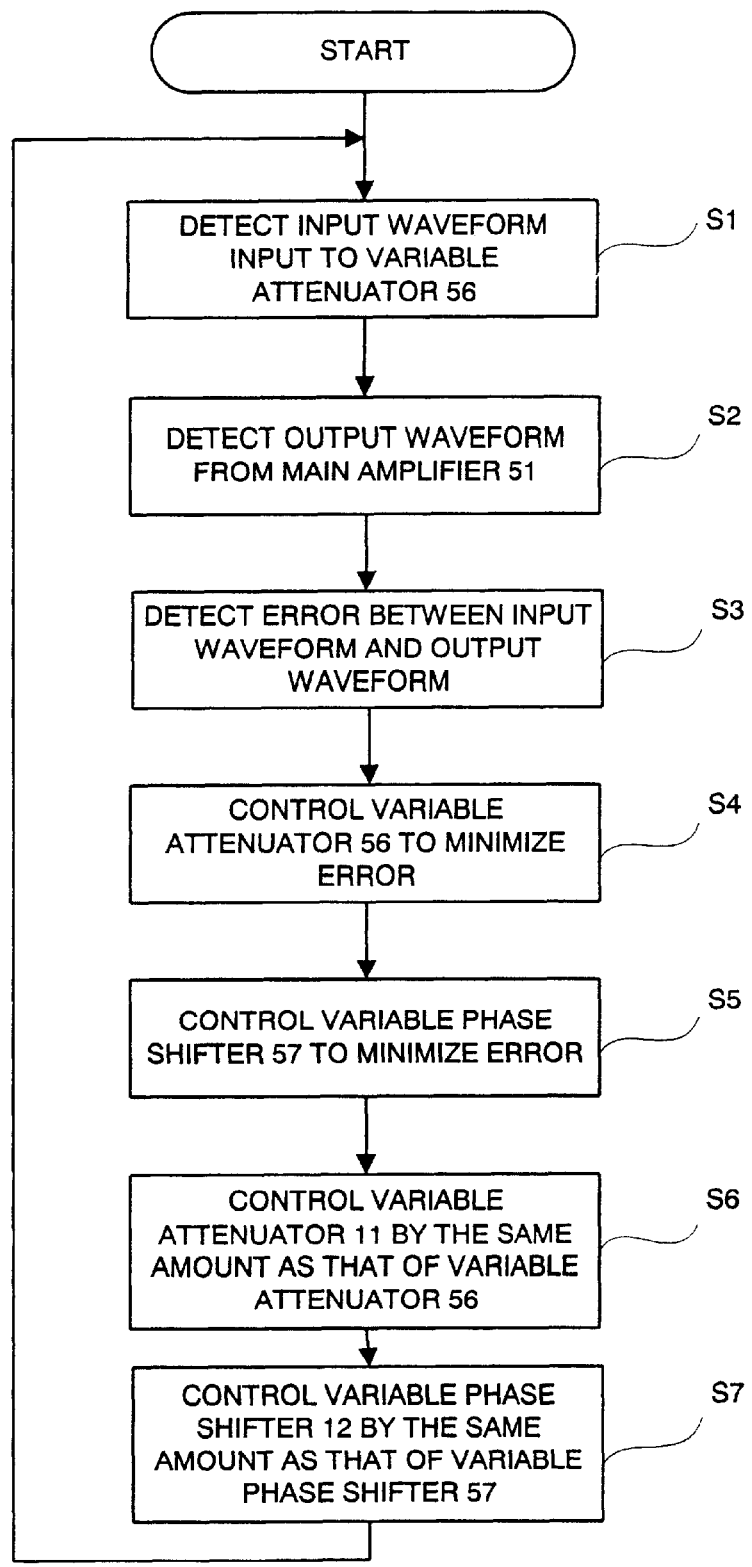

This and other objects, features, and advantages of the present invention will become more apparent upon a reading of the following detailed description and drawings, in which:

FIG. 1 is a block diagram of a feed-forward amplifier according to an embodiment of the present invention and FIG. 2 is a flowchart of a related to an embodiment of the present invention.

DESCRIPTION OF THE EMBODIMENTS

An embodiment of the present invention will be described below with reference to FIG. 1.

FIG. 1 is a block diagram illustrating a feed-forward amplifier according to the first embodiment of the present invention. FIG. 2 is a flow chart according to the embodiment of the present invention.

Referring to FIG. 1, a feed-forward amplifier of the invention includes a signal route (a) being a route for a main amplifier, a signal route (b) for detecting distortion components of the main amplifier, and signal routes (c) and (d) configuring a distortion removing loop.

Referring to FIG. 1, numeral 1 represents an input terminal for inputting a signal to be amplified. Numeral 2 represents a distributor that distributes a signal input to the terminal 1 to the signal route (a) and the signal route (b).

Numeral 3 represents a variable attenuator that attenuates signals distributed by the distributor 2 under control of the feed-forward control circuit 20 (to be described later).

Numeral 4 represents a variable phase shifter that varies the phase of a signal attenuated by the variable attenuator 3 under control of the feed-forward control circuit 20 (to be described later).

Numeral 5 represents an adaptive pre-distortion (adaptive pre-distortion compensation) amplifier that amplifies (performs a main amplification of) a signal of which the phase is varied by the variable phase shifter 4. Non-linear distortion produced in amplification is compensated in the adaptive pre-distortion system. The adaptive pre-distortion amplifier 5 consists of a main amplifier 51, an adaptive pre-distorter control circuit 52 (e.g. configured of a DSP (Digital Signal Processor), directional couplers 53 and 54, an error detector 55, a variable attenuator 56, and a variable phase shifter 57. The main amplifier 51 amplifies signals. The adaptive pre-distorter control circuit 52 varies an input signal to minimize a difference between the waveform of an input signal and the waveform of an output signal of the adaptive pre-distortion amplifier 5, thus compensating non-linear distortion of the main amplifier 51. The directional coupler 53 detects the waveform of an input signal of the adaptive pre-distortion amplifier 5. The directional coupler 54 detects the waveform of an output signal of the adaptive pre-distortion amplifier 5. The error detector 55 compares the waveform of an input signal detected by the directional coupler 53 with the waveform of an output signal detected by the directional coupler 54. The variable attenuator 56 attenuates an input signal of the adaptive pre-distortion amplifier 5 under control of the adaptive pre-distorter control circuit 52. The variable phase shifter 57 varies the phase of an input signal of the adaptive pre-distortion amplifier 5 under control of the adaptive pre-distorter control circuit 52. The variable phase shifter 57 varies the phase of an input signal of the adaptive pre-distortion amplifier 5 under control of the adaptive pre-distorter control circuit 52. A vector modulator consists of the variable attenuator 56 and the variable phase shifter 57. The adaptive pre-distorter control circuit 52 controls the variable attenuator 11 (to be described later) to vary the variable attenuator 56 by the same control amount (attenuation amount) as a varied control amount (attenuation amount). The adaptive pre-distorter control circuit 52 controls the variable phase shifter 12 (to be described later) to vary the variable phase shifter 12 (to be described later) by the same control amount (phase amount) as a varied control amount (phase amount) of the variable phase shifter 57.

Numeral 6 represents a distributor that distributes a signal amplified by the adaptive pre-distortion amplifier 5 to a delay line 7 (to be described later) and a synthsizer 14 (to be described later).

Numeral 7 represents a delay line that delays a signal distributed by the distributor 6.

Numeral 8 represents a synthesizer that synthesizes a signal distributed by the delay line 7 with a signal amplified by the auxiliary amplifier 17 (to be described later).

Numeral 9 represents an output terminal that outputs signals synthesized by the synthesizer 8.

Numeral 10 represents a pilot signal generator that creates pilot signals. The created pilot signal is injected into the signal distributed from the distributor 2 to the variable attenuator 3.

Numeral 11 represents a variable attenuator that attenuates a signal distributed by the distributer 2 under control of the adaptive pre-distorter control circuit 52.

Numeral 12 represents a variable phase shifter that varies the phase of a signal attenuated by the variable attenuator 11 under control of the adaptive pre-distorter control circuit 52. A vector modulator consists of the variable attenuator 11 and the variable phase shifter 12.

Numeral 13 represents a delay line that delays a signal with the phase varied by the variable phase shifter 12.

Numeral 14 represents a synthesizer that synthesizes a signal delayed by the delay line 13 with a signal distributed by the distributor 6.

Numeral 15 represents a variable attenuator that attenuates a signal synthesized by the synthesizer 14, under control of the feed-forward control circuit 20 (to be described later).

Numeral 16 represents a variable phase shifter that varies the phase of a signal attenuated by the variable attenuator 14, under control of the feed-forward control circuit 20 (to be described later).

Numeral 17 represents an auxiliary amplifier that amplifies a signal of which the phase is varied by the variable phase shifter 16.

Numeral 18 represents a carrier detector. The carrier detector 18 detects a carrier component (being a carrier component of a single frequency component of a signal to be amplified and supplied to the input terminal 1), based on the signal synthesized by the synthesizer 14, and then outputs the level of the detected carrier to the feed-forward control circuit 20 (to be described later).

Numeral 19 represents a pilot signal detector that detects the level of a pilot signal injected by the pilot signal generator 10, based on the signal synthesized by the synthesizer 8.

Numeral 20 represents a feed-forward control circuit that controls the variable attenuator 3 and the variable phase shifter 4 to minimize the carrier level detected by the carrier detector 18. The feed-forward control circuit 20 controls the variable attenuator 15 and the variable phase shifter 16 to minimize the level of a pilot signal detected by the pilot signal detector 19.

Next, the operation of the embodiment according to the present invention will be described below.

The distributor 2 distributes the signal input to the input terminal 1 to the signal route (a) and the signal route (b).

The pilot signal generator 10 injects a pilot signal into the signal distributed to the signal route (a). The signal, to which the pilot signal is injected, passes through the variable attenuator 3, the variable phase shifter 4, the variable attenuator 56, the variable phase shifter 57, the main amplifier 51, and the distributor 6. The distributor 6 distributes the signal input from the main amplifier 51, to the synthesizer 14 and the delay line 7. The signal route (a) is configured in such a way that the adaptive pre-distorter control circuit 52 in the adaptive pre-distortion amplifier 5 minimizes the non-linear distortion of the main amplifier 51 as small as possible.

The signal distributed to the signal route (b) is output to the synthesizer 14 through the variable attenuatior 11, the variable phase shifter 12, the delay line 13 and so on.

The synthesizer 14 synthesizes the signal sent from the distributor 6 with the signal sent from the delay line 13. That is, the synthesizer 14 synthesizes the signal passing through the signal route (a) with the signal passing through the signal route (b).

The carrier detector 18 detects the carrier level based on the synthesized signal. The carrier detector 18 outputs the detected carrier level to the feed-forward control circuit 20.

The feed-forward control circuit 20 controls the variable attenuator 3 and the variable phase shifter 4 to minimize the carrier level input from the carrier detector 18. Under this control, the signal on the signal route (a) and the signal on the signal route (b) have the same amplitude but the phases are opposite to each other. When the signal on the signal route (a) and the signal on the signal route (b) are synthesized, only the signal having the same distortion component as that of the main amplifier 51 remains. That is, the synthesizer 14 extracts the signal having the same distortion component as that of the main amplifier 51.

On the other hand, the signal which is distributed to the delay line 7 by means of the distributor 6 is output to the synthesizer 8 via the delay line 7 (signal route c).

The signal synthesized by the synthesizer 14 (corresponding to the signal having the same distortion component as that of the main amplifier 51) is output to the signal route (d). The signal is output to the synthesizer 8 via the variable attenuator 15, via the variable phase shifter 16, and via the auxiliary amplifier 17.

The synthesizer 8 synthesizes a signal input from the delay line 7 with the signal input from the auxiliary amplifier 17.

The pilot signal detector 19 detects the level of the pilot signal injected by the pilot signal generator 10 based on the synthesized signal. The pilot signal detector 19 outputs the detected pilot signal level to the feed-forward control circuit 20.

The feed-forward control circuit 20 controls the variable attenuator 15 and the variable phase shifter 16 to minimize the pilot signal level input from the pilot signal detector 19. Under the control, the signal on the signal route (c) and the signal on the signal route (d) have the same amplitude and the phases thereof are opposite to each other. Thus, the distortion produced in the main amplifier 51 can be cancelled.

Next, the operation of the adaptive pre-distortion amplifier 5 of the present invention will be explained in detail.

In connection to the error detector 55, the directional coupler 53 detects an input waveform input to the variable attenuator 56 (or a waveform of an input signal to the adaptive pre-distortion amplifier 5) (Step 1). The directional coupler 54 detects an output waveform output from the main amplifier 51 (or a waveform of an output signal from the adaptive pre-distortion amplifier 5) (Step 2). The error detector 55 compares the detected input waveform of the variable attenuator 56 with the output waveform of the main amplifier 51. The error detector 55 outputs the comparison result, or, an error (a difference between the input waveform of the variable attenuator 56 and the output waveform of the main amplifier 51), to the adaptive pre-distorter control circuit 52 (Step S3).

The adaptive pre-distorter control circuit 52 controls the attenuation amount of the variable attenuator 56 to minimize the error input by the error detector 55 (Step S4). Moreover, the adaptive pre-distorter control circuit 52 controls the phase variation of the variable phase shifter 57 to minimize the error input by the error detector 55 (Step S5). That is, the adaptive pre-distorter control circuit 52 controllably compensates the non-linear distortion of the main amplifier 51.

Controlling the variable attenuator 56 and the variable phase shifter 57 leads to shifting the phase between the input signal and the output signal of the adaptive distortion amplifier 5 by a variation between the variable attenuator 56 and the variable phase shifter 57.

The adaptive pre-distorter control circuit 52 controls the variable attenuator 11 to vary it by the same level as that of the variable attenuator 56 (Step S6). Moreover, the adaptive pre-distorter control circuit 52 controls the variable phase shifter 12 to vary it by the same level as that of the variable phase shifter 57 (Step S7). Since the above control causes the signal on the signal route (a) and the signal on the signal route (b) to be changed by the same phase, carrier components of the output of the synthesizer 14 can be minimized without being influenced due to the adaptive pre-distortion operation. In other words, even the feed forward amplifier can remove distortions without being influenced by the adaptive pre-distorter.

As explained above, the present invention can obtain the distortion compensation effect by the feed forward even when the adaptive pre-distortion amplifier having a vector modulator is used as the main amplifier.

The reason is that the delay line side of the distortion detection loop is configured of the variable attenuator, the variable phase shifter, and the delay line. Moreover, the reason is that the variable attenuator is automatically controlled by the same change as that of the variable attenuator in the adaptive pre-distortion amplifier and that the variable phase shifter is automatically controlled by the same change as that of the variable phase shifter in the adaptive pre-distortion amplifier.

The reduced distortion of the main amplifier allows the auxiliary amplifier to be miniaturized.

What is claimed is:

1. A feed-forward amplifier, comprising:

a first signal route having an amplifier;

a second signal route for creating a signal having the same amplitude as that of a signal input to the first signal route and having a phase reversed to the phase of the input signal;

wherein said feed-forward amplifier detects a distorted component of a signal amplified by said amplifier based on a signal passing through said first signal route and a signal passing through said second signal route, and removes the distorted component of the signal amplified by said amplifier based on the detected distorted component;

a first vector modulator disposed in an input route of said amplifier, for varying an input signal of said amplifier;

a second vector modulator disposed in said second signal route, for varying an input signal of said second signal route; and control means for controlling said first vector modulator to minimize distortion of said amplifier and controlling said second vector modulator to equalize a change in input signal of said amplifier due to the control to a change in input signal of said second signal route.

2. The feed-forward amplifier defined in claim 1, wherein said first vector modulator comprises a variable attenuator and a variable phase shifter and wherein said second vector modulator comprises a variable attenuator and a variable phase shifter.

3. The feed-forward amplifier defined in claim 1, wherein said first vector modulator is controlled in an adaptive pre-distortion system.

4. A feed-forward amplifier, comprising:

a first signal route having an amplifier;

a second signal route for creating a signal having the same amplitude as that of a signal input to the first signal route and having a phase reversed to the phase of the input signal;

wherein said feed-forward amplifier detects a distorted component of a signal amplified by said amplifier based on a signal passing through said first signal route and a signal passing through said second signal route, and removes the distorted component of the signal amplified by said amplifier based on the detected distorted component;

a first vector modulator disposed in an input route of said amplifier, for varying an input signal of said amplifier;

a second vector modulator disposed in said second signal route, for varying an input signal of said second signal route; and control means for controlling said first vector modulator to minimize distortion of said amplifier and controlling said second vector modulator with the same amount as that of the above control.

5. The feed-forward amplifier defined in claim 4, wherein said first vector modulator comprises a variable attenuator and a variable phase shifter and wherein said second vector modulator comprises a variable attenuator and a variable phase shifter.

6. The feed-forward amplifier defined in claim 4, wherein said first vector modulator is controlled in an adaptive pre-distortion system.

7. A feed-forward amplifier, comprising:

a first signal route having an amplifier;

a second signal route for creating a signal having the same amplitude as that of a signal input to the first signal route and having a phase reversed to the phase of the input signal;

wherein said feed-forward amplifier detects a distorted component of a signal amplified by said amplifier based on a signal passing through said first signal route and a signal passing through said second signal route, and removes the distorted component of the signal amplified by said amplifier based on the detected distorted component;

a first vector modulator disposed in an input route of said amplifier, for varying the phase of an input signal of said amplifier;

a second vector modulator disposed in said second signal route, for varying the phase of an input signal of said second signal route; and control means for controlling a phase change of said first vector modulator to minimize non-linear distortion of said amplifier and controlling said second vector modulator to the same phase change as that of said first vector modulator.

8. The feed-forward amplifier defined in claim 7,
wherein said first vector modulator comprises a variable attenuator and a variable phase shifter and wherein said second vector modulator comprises a variable attenuator and a variable phase shifter.

9. The feed-forward amplifier defined in claim 7,
wherein said first vector modulator is controlled in an adaptive pre-distortion system.

10. A feed-forward amplifier, comprising:

a first signal route having an amplifier;

a second signal route for creating a signal having the same amplitude as that of a signal input to the first signal route and having a phase reversed to the phase of the input signal;

wherein said feed-forward amplifier detects a distorted component of a signal amplified by said amplifier based on a signal passing through said first signal route and a signal passing through said second signal route, and removes the distorted component of the signal amplified by said amplifier based on the detected distorted component;

a first vector modulator disposed in an input route of said amplifier, for varying an input signal of said amplifier;

a second vector modulator disposed in said second signal route, for varying an input signal of said second signal route;

first detection means for detecting the waveform of an input signal of said first vector modulator;

second detection means disposed for detecting the waveform of an output signal of said amplifier;

means for outputting a difference between a waveform detected by said first detection means and a waveform detected by said second detection means; and control means for controlling said first vector modulator to minimize said difference and controlling said second vector modulator to equalize a change in input signal of said amplifier due to the control to a change in input signal of said second signal route.

11. The feed-forward amplifier defined in claim 10,
wherein said first vector modulator comprises a variable attenuator and a variable phase shifter and wherein said second vector modulator comprises a variable attenuator and a variable phase shifter.

12. The feed-forward amplifier defined in claim 10,
wherein said first vector modulator is controlled in an adaptive pre-distortion system.

13. A non-linear compensation method in a feed-forward amplifier, said feed-forward amplifier including a first signal route having an amplifier and a second signal route for receiving a signal input to said first signal route and creating a signal having the same amplitude as that of said input signal and having a phase reversed to the phase of the input signal, said feed-forward amplifier detecting a distorted component of a signal amplified by said amplifier based on a signal passing through said first signal route and a signal passing through said second signal route, and detecting the removed distorted component of the signal amplified by said amplifier based on the detected distorted component, said non-linear compensation method comprising:

a first detection step for detecting the waveform of an input signal of said amplifier;

a second detection step for detecting the waveform of an output signal of said amplifier;

a third detection step for detecting a difference between the waveform of an output signal detected in said first detection step and the waveform of an output signal detected in said second detection step;

a step for varying an input signal of said amplifier to minimize the difference detected in said third detection step; and a step for varying an input signal of said second signal route to the same change as a change in input signal of said amplifier.

* * * * *